(12) United States Patent
Anderson et al.

(10) Patent No.: US 10,304,955 B2
(45) Date of Patent: May 28, 2019

(54) FABRICATION OF A VERTICAL FIELD EFFECT TRANSISTOR DEVICE WITH A MODIFIED VERTICAL FIN GEOMETRY

(71) Applicant: INTERNATIONAL BUSINESS MACHINES CORPORATION, Armonk, NY (US)

(72) Inventors: Brent A. Anderson, Jericho, VT (US); Edward J. Nowak, Shelburne, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/142,576

(22) Filed: Sep. 26, 2018

(65) Prior Publication Data

US 2019/0027599 A1    Jan. 24, 2019

Related U.S. Application Data

(62) Division of application No. 15/439,489, filed on Feb. 22, 2017, now Pat. No. 10,134,893.

(51) Int. Cl.
| | | |
|---|---|---|
| *H01L 29/78* | (2006.01) | |
| *H01L 29/66* | (2006.01) | |
| *H01L 29/06* | (2006.01) | |
| *H01L 29/10* | (2006.01) | |

(52) U.S. Cl.
CPC ...... *H01L 29/7827* (2013.01); *H01L 29/0657* (2013.01); *H01L 29/1037* (2013.01); *H01L 29/66666* (2013.01)

(58) Field of Classification Search
CPC .......... H01L 29/7827; H01L 29/66666; H01L 29/1037; H01L 29/065

USPC .......................................................... 257/329
See application file for complete search history.

(56) References Cited

U.S. PATENT DOCUMENTS

| | | | |
|---|---|---|---|
| 5,073,519 | A  | 12/1991 | Rodder |
| 6,008,519 | A  | 12/1999 | Yuan et al. |
| 9,087,897 | B1 | 7/2015  | Anderson et al. |
| 2010/0308400 | A1 | 12/2010 | Darwish et al. |
| 2011/0068405 | A1 | 3/2011  | Yuan et al. |
| 2014/0264497 | A1 | 9/2014  | Lam et al. |

(Continued)

FOREIGN PATENT DOCUMENTS

JP    2014063929    4/2014

OTHER PUBLICATIONS

Moroz et al., "Intentional Distortion of Transistor Shape to Improve Circuit Performance", IEEE Electron Device Letters, vol. 31, No. 1. Nov. 6, 2009. pp. 1-3.

(Continued)

*Primary Examiner* — Caleen O Sullivan
(74) *Attorney, Agent, or Firm* — Tutunjian & Bitetto, P.C.; Vazken Alexanian

(57) ABSTRACT

A vertical transport fin field effect transistor (VTFET) with a smaller cross-sectional area at the top of the fin than at the bottom, including, a substrate, a vertical fin on the substrate, wherein the vertical fin has a cross-sectional area at the base of the vertical fin that is larger than a cross-sectional area at the top of the vertical fin, wherein the cross-sectional area at the top of the vertical fin is in the range of about 10% to about 75% of the cross-sectional area at the base of the vertical fin, and a central gated region between the base and the top of the vertical fin.

20 Claims, 15 Drawing Sheets

(56) References Cited

U.S. PATENT DOCUMENTS

2015/0380313 A1   12/2015   Ching et al.

OTHER PUBLICATIONS

Saffih et al., "Fabrication of silicon nanostructures with large taper angle by reactive ion etching", Journal of Vacuum Science & Technology B, Nanotechnology and Microelectronics: Materials, Processing, Measurement and Phenomena. vol. 32. Issue 6. Nov. 12, 2014. pp. 1-5.

List of IBM Patents or Patent Applications Treated as Related dated Sep. 26, 2018, 2 pages.

FABRICATION OF A VERTICAL FIELD EFFECT TRANSISTOR DEVICE WITH A MODIFIED VERTICAL FIN GEOMETRY

BACKGROUND

Technical Field

The present invention generally relates to a fabrication process and an integrated circuit device structure having a reduced top source/drain capacitance and a reduced bottom source/drain resistance, and more particularly to a vertical transport fin field effect transistor (VTFET) having a smaller channel-to-top drain contact area and a larger channel-to-bottom source contact area.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin approximately rectangular silicon (Si), commonly referred to as the fin with a gate on the fin, as compared to a MOSFET with a single gate in the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS) device, where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components.

SUMMARY

In accordance with an embodiment of the present invention, a vertical transport fin field effect transistor (VTFET) with a smaller cross-sectional area at the top of the fin than at the bottom, including, a substrate, a vertical fin on the substrate, wherein the vertical fin has a cross-sectional area at the base of the vertical fin that is larger than a cross-sectional area at the top of the vertical fin, wherein the cross-sectional area at the top of the vertical fin is in the range of about 10% to about 75% of the cross-sectional area at the base of the vertical fin, and a central gated region between the base and the top of the vertical fin is provided.

In accordance with another embodiment of the present invention, a vertical transport fin field effect transistor (VTFET) with a smaller cross-sectional area at the top of the fin than at the bottom, including, a substrate, a doped region in the substrate forming a bottom source, and a vertical fin having two sidewalls separated by a thickness, and two end walls separated by a length on the bottom source, wherein the end walls taper from the base of the vertical fin adjacent to the bottom source to the top of the vertical fin opposite the base and separated by a height of the vertical fin is provided.

In accordance with yet another embodiment of the present invention, a method of forming a vertical transport fin field effect transistor (VTFET) with a smaller cross-sectional area at the top of the fin than at the base of the fin, including, forming a vertical fin on a substrate, wherein the vertical fin has two sidewalls separated by a thickness, and two end walls separated by a length, and etching the fin to taper at least the end walls, such that the cross-sectional area at the top of the fin is in the range of about 10% to about 75% of the cross-sectional area at the base of the vertical fin is provided.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
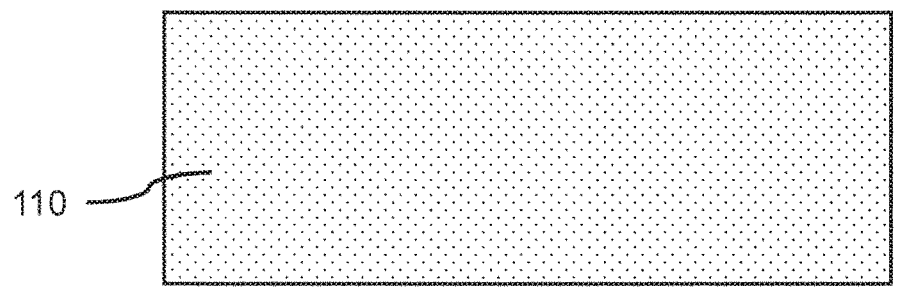
FIG. 1 is a cross-sectional side view showing a substrate, in accordance with an embodiment of the present invention.

Principles and embodiments of the present invention relate generally to forming a vertical fin having a modified geometry, where the area of a top surface of the vertical fin intended to be in direct contact with a top source/drain is reduced in comparison with the surface area the vertical fin would have with an unmodified geometry.

Principles and embodiments of the present disclosure are also generally related to a vertical transport field effect transistor (VTFET) having a channel geometry that reduces a channel-to-drain capacitance, while avoiding an increase in source-to-channel resistance. A vertical transport field effect transistor (VTFET) can have current flowing from a bottom source vertically through a channel formed by a vertical fin to a top drain. Vertical transistors can have high capacitance due to the large interfaces created at the bottom source/drain and the top source/drain. This capacitance can result in degraded device speed and higher circuit/chip power usage. It has been recognized that reducing the contact area at the interface between a VTFET channel and a top drain can provide a reduced capacitance, which may increase device speed (e.g., switching speed). In addition, it has been recognized that maintaining or increasing the contact surface between a VTFET bottom source and the channel can provide a reduced resistance, which can increase the device drive current. The combination of a larger source-to-channel contact area and a smaller channel-to-drain contact area can provide a faster VFET with increased drive current. A reduction in drain size can also reduce drain-induced barrier lowering (DIBL), which may decrease OFF-state current, and/or lower subthreshold-swing value. The ratio of the ON-state current to the OFF-state current, $I_{on}/I_{off}$, may also improve.

Exemplary applications/uses to which the present invention can be applied include, but are not limited to: logic (e.g., NAND, NOR, XOR, etc.) and memory devices (e.g., SRAM, DRAM, etc.) utilizing vertical transport FinFET devices.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial or hetero-epitaxial processes, and the deposited material can be crystalline. In various embodiments, formation of a layer can be by one or more deposition processes, where, for example, a conformal layer may be formed by a first process (e.g., Thermal ALD, PEALD, etc.) and a fill may be formed by a second process (e.g., CVD, electrodeposition, PVD, etc.).

It is to be understood that the present invention will be described in terms of a given illustrative architecture; however, other architectures, structures, substrate materials and process features and steps can be varied within the scope of the present invention.

It should be noted that certain features may not be shown in all figures for the sake of clarity. This is not intended to be interpreted as a limitation of any particular embodiment, or illustration, or scope of the claims.

Reference to source/drain projections, layers, regions, etc., is intended to indicate that the particular device feature can be implemented as a source or a drain except as expressly indicated otherwise, for example, by specific reference to a component as a source or a drain. In addition, the role of source and drain for an active device can in some instances be reversed, so a previously indicated drain may instead be a source and vice versa. Reference to a source/drain is, therefore, intended to encompass the broadest reasonable scope of the term.

Referring now to the drawings in which like numerals represent the same or similar elements and initially to FIG.

1, a cross-sectional side view of a substrate is shown, in accordance with an embodiment of the present invention.

In one or more embodiments, a substrate 110 can be a semiconductor or an insulator with an active surface semiconductor layer. The substrate can include a carrier layer that provides structural support to other layers. The substrate can include crystalline, semi-crystalline, microcrystalline, or amorphous regions. The substrate can be essentially (i.e., except for contaminants) a single element (e.g., silicon), primarily (i.e., with doping) of a single element, for example, silicon (Si) or germanium (Ge), or the substrate can include a compound, for example, $Al_2O_3$, $SiO_2$, GaAs, SiC, or SiGe. The substrate can also have multiple material layers, for example, a semiconductor-on-insulator substrate (SeOI), such as, a silicon-on-insulator substrate (SOI), germanium-on-insulator substrate (GeOI), or silicon-germanium-on-insulator substrate (SGOI). The substrate can also have other layers forming the substrate, including high-k oxides and/or nitrides. The substrate may also include other previously fabricated devices and features.

In one or more embodiments, the substrate 110 can be a silicon wafer. In various embodiments, the substrate can be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

In various embodiments, the substrate 110 can provide the material for forming one or more vertical fin(s), where the vertical fin(s) can form a channel of a fin field effect transistor (FinFET), where the FinFEt can be a vertical transport FinFET. A material layer different from the material of the substrate surface or carrier layer can be formed on the surface, for example, a silicon-germanium layer on a single crystal silicon surface to form a strained surface active layer to provide the material for forming one or more vertical fin(s) 111, where the surface active layer can be part of the substrate 110.

Figure 2:
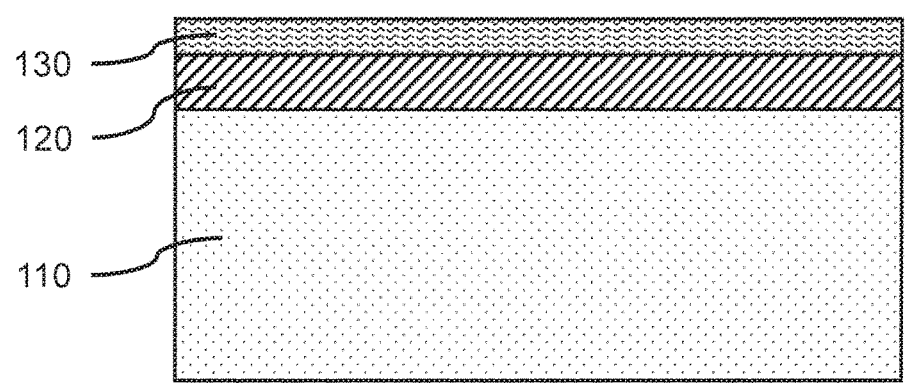
FIG. 2 is a cross-sectional side view showing a fin template layer formed on the surface of the substrate, and a fin mask layer formed on the fin template layer, in accordance with an embodiment of the present invention.

FIG. 2 is a cross-sectional side view showing a fin template layer formed on the surface of the substrate, and a fin mask layer formed on the fin template layer, in accordance with an embodiment of the present invention.

In one or more embodiments, a fin template layer 120 can be formed on at least a portion of a surface of a substrate 110. In various embodiments, the fin template layer 120 can be formed on the substrate surface by CVD, PECVD, PVD, thermal growth, or combinations thereof, where the fin template layer 120 can be blanket deposited on the substrate.

In one or more embodiments, the fin template layer 120 can have a thickness in the range of about 20 nm to about 70 nm, or in the range of about 20 nm to about 50 nm, or in the range of about 50 nm to about 70 nm, or in the range of about 30 nm to about 60 nm, where the thickness of the fin template layer 120 can define the height of subsequently formed source/drain projections. Other thicknesses are also contemplated.

In various embodiments, a fin template layer 120 can be a hard mask layer for masking the substrate during transfer of a vertical fin pattern to the substrate 110. The fin template layer 120 can be silicon oxide (SiO), silicon nitride (SiN), silicon oxynitride (SiON), silicon carbonitride (SiCN), silicon boronitride (SiBN), silicon carbide (SiC), silicon borocarbide (SiBC), silicon boro carbonitride (SiBCN), boron carbide (BC), boron nitride (BN), titanium nitride (TiN), or combinations thereof, where the fin template layer 120 may include one or more layers. The fin template layer 120 can also act as an etch-stop layer, where the fin template layer 120 can be selectively etched relative to other layers.

In one or more embodiments, a fin mask layer 130 can be formed on the fin template layer 120, where the fin mask layer 130 can be a hard mask layer or soft mask layer for masking the fin template layer 120. In one or more embodiments, the fin mask layer 130 can be a lithographic resist material (e.g., a photo resist material, an e-beam resist material, etc.).

In one or more embodiments, the fin mask layer 130 can be a positive or negative resist material, for example, Poly(methyl methacrylate) (PMMA) or SU-8, or an electron-beam (e-beam) cured material, for example, hydrogen silsesquioxane (HSQ).

In one or more embodiments, the fin mask layer 130 can be formed on the fin template layer 120 by a spin on process.

Figure 3:
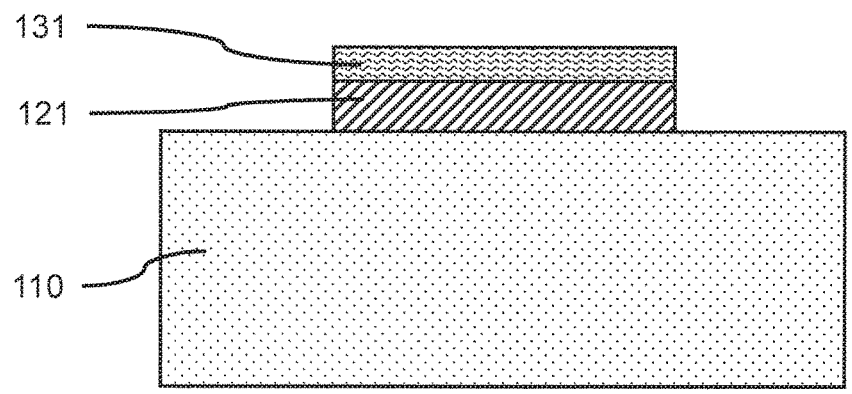
FIG. 3 is a cross-sectional side view showing a patterned fin mask layer on a patterned fin template layer, in accordance with an embodiment of the present invention.

FIG. 3 is a cross-sectional side view showing a patterned fin mask layer on a patterned fin template layer, in accordance with an embodiment of the present invention.

In one or more embodiments, the fin mask layer 130 can be patterned and developed to form a fin mask segment 131 on the fin template layer 120, where the fin mask segment 131 covers a portion of the fin template layer 120 and exposes other portions of the fin template layer. The fin mask layer 130 can be patterned and developed using processes known in the art. A plurality of fin mask segments 131 can form a fin pattern on the fin template layer 120.

In one or more embodiments, the fin pattern formed by the fin mask segment(s) 131 can be transferred to the fin template layer 120 by removing the exposed portion of the fin template layer 120. In various embodiments, a portion of the fin template layer 120 can be removed to form a fin template 121 below each of the one or more fin mask segment(s) 131 by a directional reactive ion etch (RIE). Removal of the portions of the fin template layer 120 can expose portions of the underlying substrate 110 or surface/active layer(s) between each of the fin mask segments 131 and fin templates 121. The lateral dimensions of the fin mask segments 131 and fin templates 121 can define the lateral dimensions of a top surface of a vertical fin.

Figure 4:
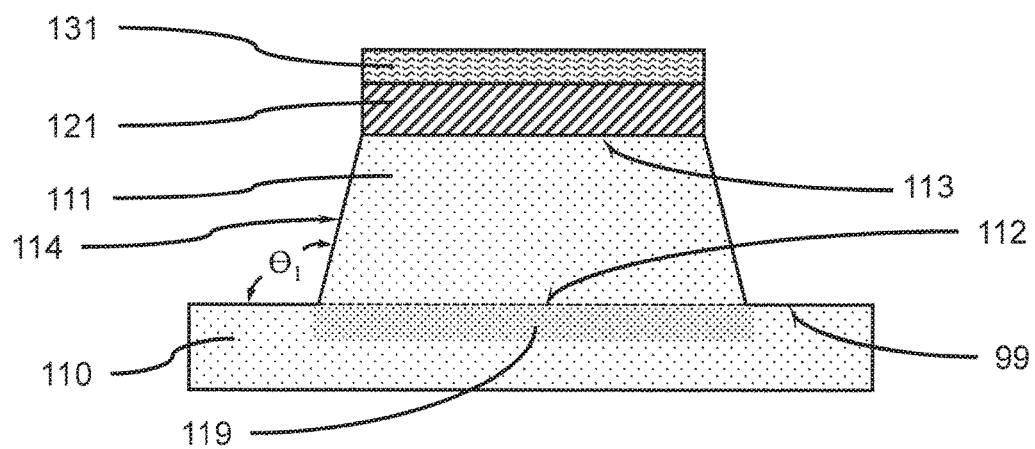
FIG. 4 is a cross-sectional side view showing a vertical fin formed on the substrate with a fin template and a fin mask segment on the vertical fin, in accordance with an embodiment of the present invention.

FIG. 4 is a cross-sectional side view showing a vertical fin formed on the substrate with a fin template and a fin mask segment on the vertical fin, in accordance with an embodiment of the present invention.

In one or more embodiments, one or more vertical fin(s) 111 can be formed on the substrate 110 or a surface active layer, where the vertical fin(s) 111 can be formed by removing a portion of the substrate 110 between and/or around the fin mask segment(s) 131 and fin template(s) 121. One or more vertical fin(s) 111 can be formed by a directional etch, for example, a reactive ion etch (RIE) that removes the portion of the substrate 110 or surface active layer not covered by the fin mask segment(s) 131 and fin template(s) 121. The removal of the substrate material can form vertical fin(s) 111 with a tapered profile having a greater length and width at the base 112 of the vertical fin(s) and a shorter length and narrower width at the top surface 113 of the vertical fin(s) 111, or with a straight profile (i.e., an essentially uniform width), where the tapered profile can be produced as an aspect of the etching process (e.g., control of reactants and/or processing parameters).

In one or more embodiments, the surface area of the top surface 113, $A_{ts}$, of a vertical fin 111 in contact with a bottom surface of a fin template 121 can be less than the cross-sectional area of the base 112, $A_{bcr}$, of the vertical fin at the plane of the substrate surface 99 ($Ats<A_{bcr}$) adjacent to the vertical fin. The top surface 113 and base 112 can be parallel. The vertical fin 111 includes two sidewalls separated by a thickness, and two end walls separated by a length, and wherein the end walls can taper from the base of the fin to the top of the fin, such that the end walls 114 of the vertical fin 111 can form an obtuse angle, $\theta_1$, between the end wall 114 and substrate surface.

In various embodiments, the area at the top of the vertical fin may be measured as a cross-sectional area, $A_{tcr}$, when the top surface is not uniform or not easily determined. The measurements of $A_{ts}$ or $A_{tcr}$, and $A_{bcr}$ can be in a plane that is normal to the direction of extension of the vertical fin from the substrate surface. In various embodiments, the plane of the cross-sectional area, $A_{bcr}$, of the base 112 of the vertical fin and plane of the cross-sectional area, $A_{tcr}$, are parallel, and separated by a distance less than or equal to the height of the vertical fin 111. The height of the plane of the cross-sectional area, $A_{tcr}$, from the base 112 can be at a distance where a further increase in height results in an accelerating decrease in the cross-sectional area compared to a previously steady decrease in the cross-sectional area for a vertical fin that does not have a flat, uniform top surface (e.g., a negative second derivative (curved surface) compared to a zero negative derivative (constant slope)). In various embodiments, the height of the plane of the cross-sectional area, $A_{tcr}$, from the base 112 can be at least 95% of the perpendicular distance from the base 112 to a highest point of the vertical fin 111.

The substrate 110 may have a doped region 119 below a vertical fin 111 to form a bottom source/drain region. The doped region 119 may be formed in-situ or ex-situ below the vertical fin(s) 111. In various embodiments, the doped region may be n-doped or p-doped. The doped region may be formed by ion implantation and annealed to form a bottom source/drain. The vertical fin(s) 111 may be doped to have a doping type (e.g., n-doped or p-doped) opposite the doped region, or the vertical fin(s) 111 may be an intrinsic semiconductor to form a fully depleted channel. The vertical fin(s) 111 may be doped in-situ or ex-situ.

Figure 5:
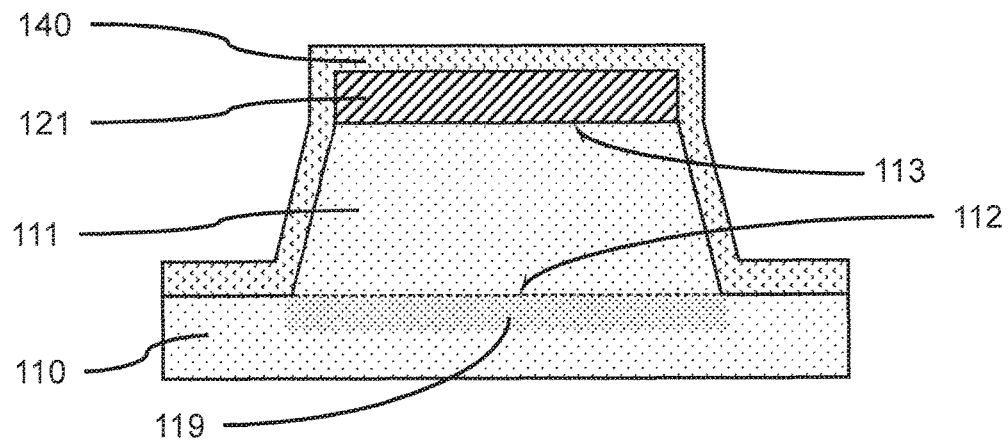
FIG. 5 is a cross-sectional side view showing a spacer layer formed on the vertical fin and fin template after removal of the fin mask segment, in accordance with an embodiment of the present invention.

FIG. 5 is a cross-sectional side view showing a spacer layer formed on the vertical fin and fin template after removal of the fin mask segment, in accordance with an embodiment of the present invention.

In one or more embodiments, the fin mask segment(s) 131 can be removed using processes known in the art, for example, ashing, stripping, chemical-mechanical polishing, etc. Removal of the fin mask segment(s) 131 can expose the top surface of the fin template(s) 121.

In one or more embodiments, a bottom spacer layer 140 can be formed on the fin template(s) 121, vertical fin(s) 111 and exposed surfaces of the substrate 110, where the bottom spacer layer 140 can be blanket deposited by CVD, PECVD, PVD, high density plasma (HDP), gas cluster ion beam (GCIB), enhanced High Aspect Ratio Process (eHARP), or combinations thereof, or conformally deposited by ALD, PEALD, pulsed plasma CVD, or combinations thereof.

In one or more embodiments, the bottom spacer layer 140 can be a silicon nitride (SiN), a carbon-doped silicon nitride (SiCN), a silicon oxynitride (SiON), silicon boro crbonitride (SiBCN), silicon oxycarbonitride (SiOCN), or combinations thereof. The silicon nitride can include stoichiometric silicon nitride ($Si_3N_4$) and other stoichiometric ratios of silicon and nitrogen.

In one or more embodiments, the bottom spacer layer 140 can have a thickness in the range of about 1 nm to about 25 nm, or in the range of about 1 nm to about 10 nm, or about 1 nm to about 5 nm, although other thicknesses are contemplated. The thickness of the spacer layer 140 on the horizontal surfaces can be greater than the thickness on the slanted or vertical surfaces.

Figure 6:
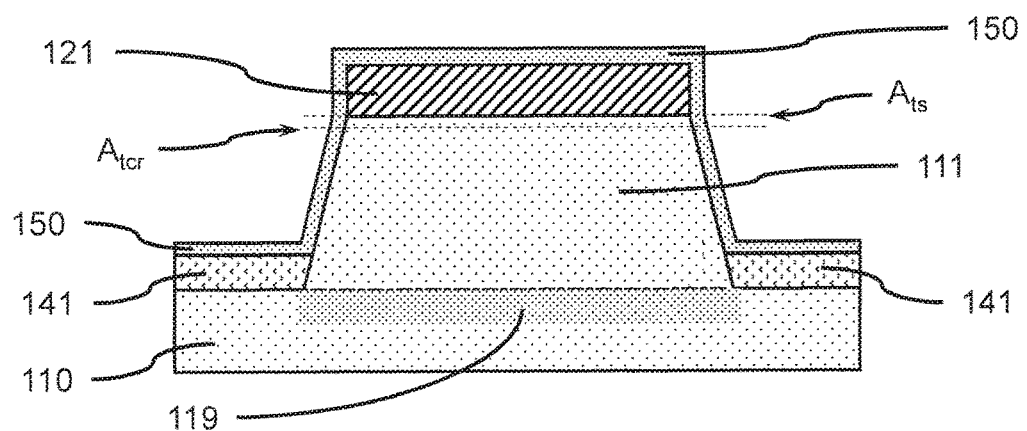
FIG. 6 is a cross-sectional side view showing a gate dielectric layer formed on a bottom spacer, vertical fin, and fin template after removal of the portion of the spacer layer on the vertical fin and fin template, in accordance with an embodiment of the present invention.

FIG. 6 is a cross-sectional side view showing a gate dielectric layer formed on a bottom spacer, vertical fin, and fin template after removal of the portion of the spacer layer on the vertical fin and fin template, in accordance with an embodiment of the present invention.

In one or more embodiments, a portion of the spacer layer 140 can be removed from the vertical fin 111 and fin template 121, while a portion of the spacer layer 140 remains on the substrate surface 99 to form one or more bottom spacers 141. In various embodiments, the portion of the spacer layer 140 can be removed can be removed using an isotropic etch (e.g., wet etch, dry plasma etch, etc.), where thinner portions of the spacer layer 140 can be removed to expose the end walls and sidewalls of the vertical fin(s) 111, while a portion of the spacer layer 140 remains on the substrate surface 99. The portion of the spacer layer 140 on the top surface of the fin template 121 can be removed by using an organic planarization layer (OPL) and a chemical-mechanical polishing (CMP) before performing an isotropic etch. The OPL can be removed after the CMP.

In one or more embodiments, a gate dielectric layer 150 can be formed on the exposed surfaces of the fin template(s) 121, vertical fin(s) 111, and substrate 110, where the gate dielectric layer 150 can be conformally deposited by ALD, PEALD, CVD, PECVD, or combinations thereof. The gate dielectric layer 150 can be formed on the end walls and sidewalls of the vertical fin 111, such that the gate dielectric layer forms a continuous layer around four sides of the vertical fin.

In one or more embodiments, the gate dielectric layer 150 can be an insulating dielectric layer, for example, a silicon oxide (SiO), silicon nitride (SiN), silicon oxynitride (SiON), a high-K dielectric, or a suitable combination of these materials.

In various embodiments, the gate dielectric layer 150 can be a high-K dielectric material that can include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide(e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$-$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k material can further include dopants such as lanthanum and/or aluminum. The stoichiometry of the high-K compounds can vary.

In one or more embodiments, the gate dielectric layer 150 can have a thickness in the range of about 1 nm to about 11 nm, or can have a thickness in the range of about 2 nm to about 8 nm.

Figure 7:
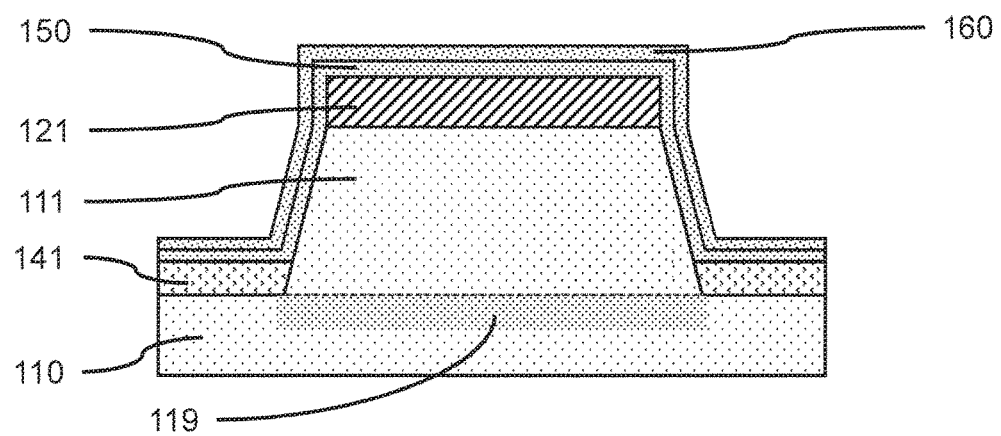
FIG. 7 is a cross-sectional side view showing a work function layer on the gate dielectric layer, in accordance with an embodiment of the present invention.

FIG. 7 is a cross-sectional side view showing a work function layer on the gate dielectric layer, in accordance with an embodiment of the present invention.

In one or more embodiments, a work function layer 160 can be formed on the exposed surfaces of the gate dielectric layer 150, where the work function layer 160 can be conformally deposited by ALD, PEALD, CVD, PECVD, or combinations thereof.

In one or more embodiments, a work function layer 160 can be formed on the gate dielectric layer 150, where the work function layer 160 and gate dielectric layer 150 can surround at least a portion of each of one or more vertical fin(s) 111 as a part of a gate structure. The work function layer 160 can be formed on the gate dielectric layer 150 to adjust the electrical properties of a gate electrode. In various embodiments, the work function layer 160 can be optional.

In various embodiments, a work function layer 160 can be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer 160 can include multiple layers of work function materials, for example, a work function layer can be a TiN/TiC stack.

In various embodiments, the work function layer 160 can have a thickness in the range of about 1 nm to about 11 nm, or can have a thickness in the range of about 2 nm to about 8 nm.

Figure 8:
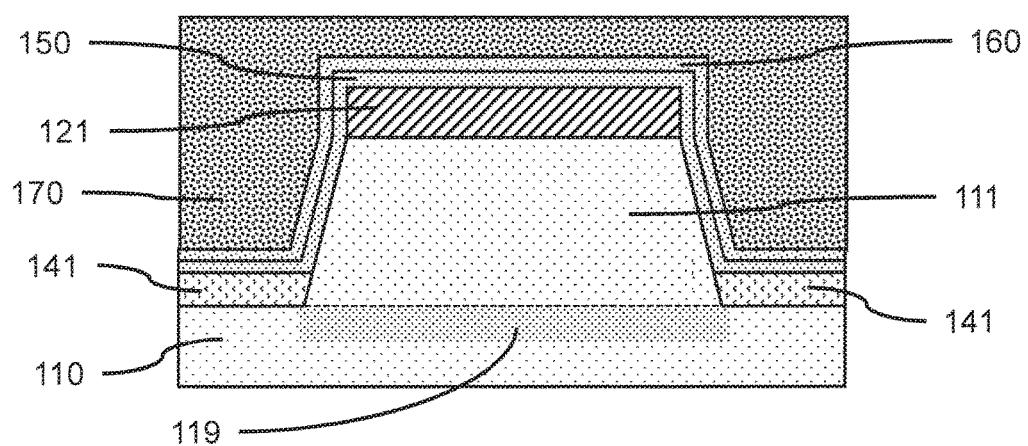
FIG. 8 is a cross-sectional side view showing a gate fill layer on the work function layer, in accordance with an embodiment of the present invention.

FIG. 8 is a cross-sectional side view showing a gate fill layer on the work function layer, in accordance with an embodiment of the present invention.

In one or more embodiments, a gate fill layer 170 can be formed on the gate dielectric layer 150 and/or work function layer 160 if present, where the gate fill layer 170 can fill in the space between vertical fins 111. The gate fill layer 170, gate dielectric layer 150, and optionally the work function layer 160, can form a gate structure on one or more vertical fin(s) 111, where the gate fill layer 170 and work function layer 160 can form a conductive gate electrode. The gate structure formed on the fin can wrap around the two end walls and two sidewalls of each vertical fin 111 to cover at least a portion of the vertical fin forming a channel. The gate structure can be on the bottom spacer 141 and around a central portion of the vertical fin.

In various embodiments, the gate fill layer 170 can be a p-doped poly silicon (p-Si), an n-doped poly silicon (n-Si), a conductive metal, where the metal can be tungsten (W) or cobalt (Co), or a conductive carbon material (e.g., carbon nanotube, graphene, etc.), or any suitable combinations thereof. The gate fill layer 170 can be a heavily p-doped poly silicon to form a pFET, or a heavily n-doped poly silicon to form an nFET.

In one or more embodiments, the gate fill layer 170 can be blanket deposited, and a chemical-mechanical polishing (CMP) used to remove gate fill layer material that extends above the top surfaces of the gate dielectric layer 150 and/or work function layer 160 if present, where the CMP can provide a smooth, flat surface.

Figure 9:
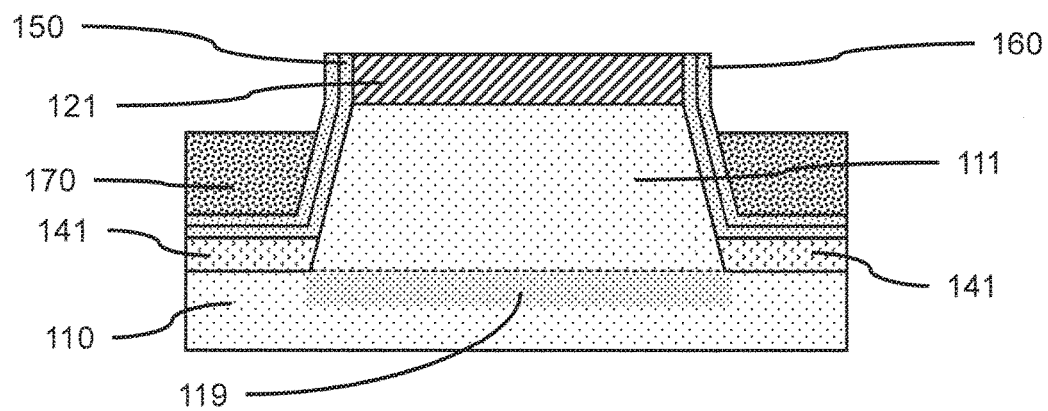
FIG. 9 is a cross-sectional side view showing a gate structure with a reduced height gate fill layer, in accordance with an embodiment of the present invention.

FIG. 9 is a cross-sectional side view showing a gate structure with a reduced height gate fill layer, in accordance with an embodiment of the present invention.

In one or more embodiments, the gate fill layer 170 and work function layer 160 if present, can be recessed to provide space for formation of a subsequent top spacer layer. In various embodiments, each of the gate fill layer 170, gate dielectric layer 150 and/or work function layer 160 can be partially removed using a selective etch (e.g., RIE). The gate fill layer 170, gate dielectric layer 150 and/or work function layer 160 can be reduced to a depth equal to or below the fin template(s) 121 to provide space for formation of top source/drains on the top surfaces of the vertical fin(s) 111. The height of the gate electrode can determine the length of a channel in a vertical transport field effect transistor. In various embodiments, the gate structure can wrap around a middle portion of the vertical fin 111 to form a central gated region between the base of the vertical fin and the top of the vertical fin. In various embodiments, the gate structure 175 can cover a central ⅓ to ⅘ of the vertical fin height, or about a central ⅓ to about ⅔ of the vertical fin height, where the gate structure and fin height can determine the effective gate length of a VTFET device.

Figure 10:
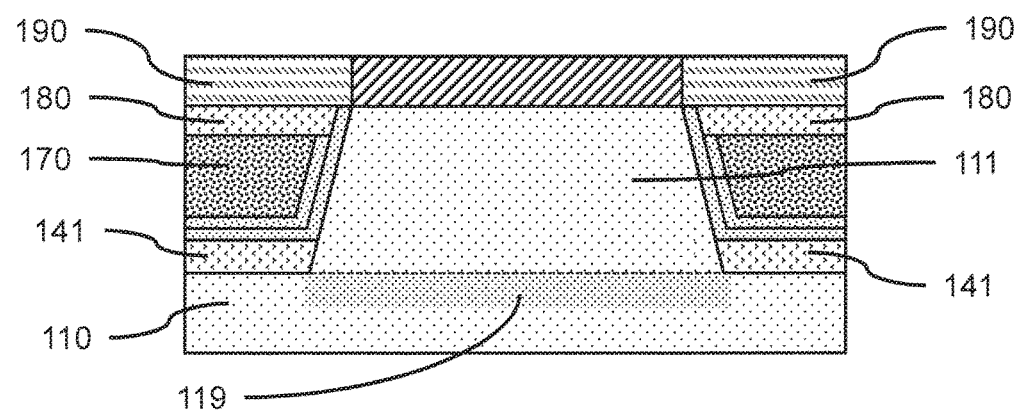
FIG. 10 is a cross-sectional side view showing a gate structure formed on the vertical fin, and a top spacer formed on the exposed portions of the gate structure, in accordance with an embodiment of the present invention.

FIG. 10 is a cross-sectional side view showing a gate structure formed on the vertical fin, and a top spacer formed on the exposed portions of the gate structure, in accordance with an embodiment of the present invention.

In one or more embodiments, a top spacer layer 180 can be formed on the gate fill layer 170, gate dielectric layer 150 and/or work function layer 160 of the gate structure, where the top spacer layer 180 can be blanket deposited, for example, by CVD, PECVD, PVD, etc. In various embodiments, the height of the top spacer layer 180 can be reduced, for example, by CMP and/or an RIE, to equal to or below the bottom surface of the fin template 121.

In one or more embodiments, a top spacer layer 180 can be the same material used for the bottom spacer layer 140, or multiple layers thereof. In various embodiments, the top spacer layer 180 can be thicker than the bottom spacer 141 to provide reduced channel-drain capacitance.

In one or more embodiments, an interlayer dielectric (ILD) layer 190 can be formed on the top spacer layer 180, fin template 121, and gate dielectric layer 150. The ILD layer 190 can be silicon oxide (SiO), a flowable oxide, a polymeric material, a low-k dielectric, or combinations thereof. A low-k dielectric material can include, but not be limited to, a fluoride-doped silicon oxide (e.g., fluoride doped glass), a carbon doped silicon oxide, a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof.

Figure 11:
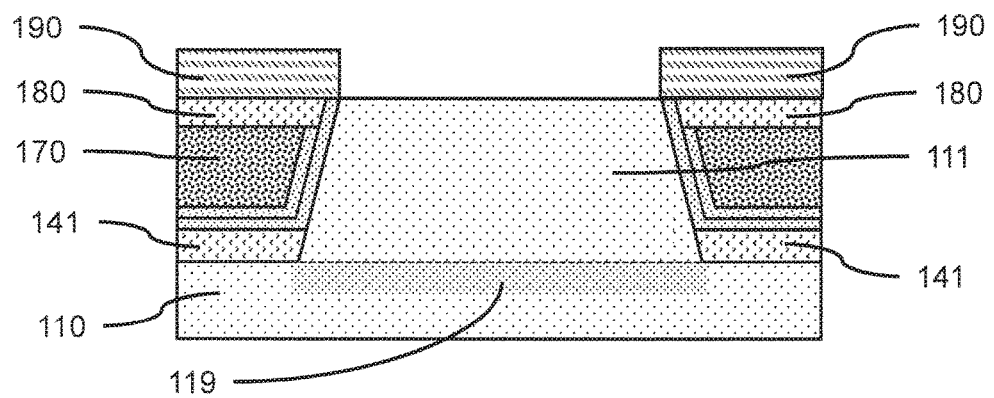
FIG. 11 is a cross-sectional side view showing a vertical fin with an exposed top surface after removal of the fin template, in accordance with an embodiment of the present invention.

FIG. 11 is a cross-sectional side view showing a vertical fin with an exposed top surface after removal of the fin template, in accordance with an embodiment of the present invention.

In one or more embodiments, a portion of the interlayer dielectric (ILD) layer 190 can be removed to expose the fin template 121, where the ILD layer extending above the fin template 121 may be removed using CMP.

In one or more embodiments, the exposed fin template 121 can be removed, for example, by using a selective etch (e.g., RIE, wet etch, etc.) to expose the top surface of the vertical fin 111. The vertical fin can be a single crystal material with a predetermined crystal face/orientation at the top surface.

Figure 12:
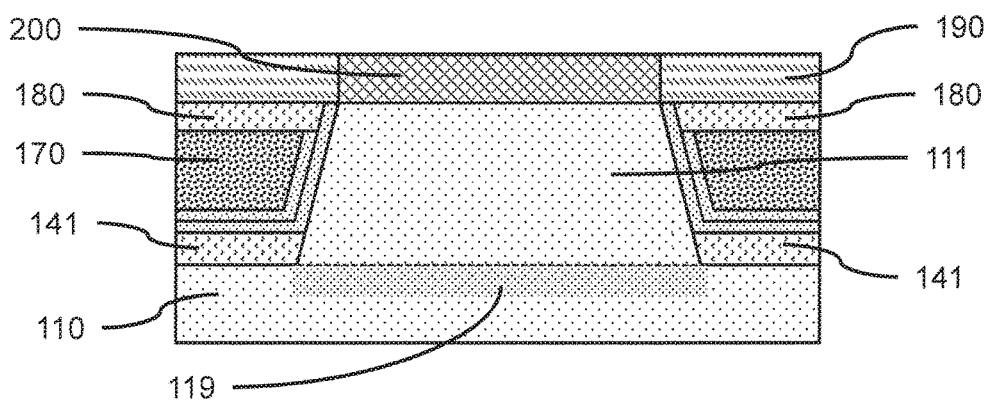
FIG. 12 is a cross-sectional side view showing a top source/drain formed on the vertical fin, in accordance with an embodiment of the present invention.

FIG. 12 is a cross-sectional side view showing a top source/drain formed on the vertical fin, in accordance with an embodiment of the present invention.

In one or more embodiments, a top source/drain 200 can be formed on the vertical fin 111, where the top source/drain 200 can be formed by an epitaxial growth process on a single crystal surface of the vertical fin. The top source/drain 20 may be suitably doped to form an n-type or a p-type FinFET device.

In various embodiments, a source is at the bottom of the vertical fin 111 and a drain is at the top of the fin, such that the smaller surface or cross-sectional area at the top of the vertical fin 111 provides a reduced drain-channel capacitance. The top source/drain 200 can be a top drain, where the reduced contact area between the top drain and the surface of the vertical fin can provide a reduced capacitance compared to a vertical fin 111 with straight sidewalls and the same cross-sectional area at the top and bottom of the vertical fin. A fully depleted channel can be between the bottom source and top drain, and surrounded by central gated region.

Figure 13:
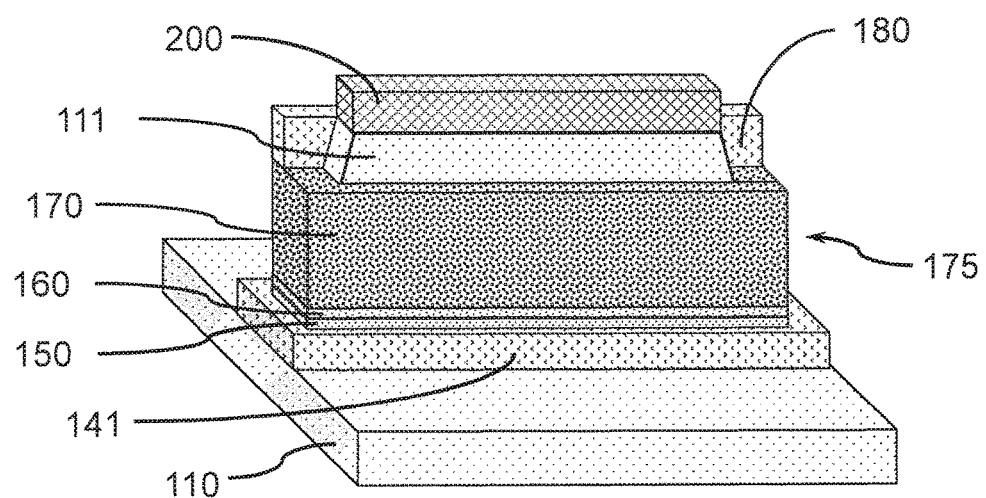
FIG. 13 is an orthographic cut-away view of an exemplary vertical fin having inclined end walls and sidewalls tapering inwardly in the direction of the top surface, and a gate structure and top spacer on the vertical fin, in accordance with an embodiment of the present invention.

FIG. 13 is an orthographic cut-away view of an exemplary vertical fin having inclined end walls and sidewalls tapering inwardly in the direction of the top surface, and a gate structure and top spacer on the vertical fin, in accordance with an embodiment of the present invention.

In one or more embodiments, the contact area between a vertical fin 111 and a top drain 200 may be reduced by forming the vertical fin with one or more tapered side or end walls ending at a smaller truncated top portion. The contact area between a vertical fin and a top drain may also be reduced by removing portions of the vertical fin at the interface between a VTFET channel and the top drain. In various embodiments, a portion of a vertical fin 111 including a section of the top surface may be removed to a predetermined depth to reduce the contact area between the top drain 200 and the top surface of the VTFET channel to thereby reduce the capacitance at the channel-drain interface. The top spacer 180 can be formed on the gate fill layer 170 of the gate structure 175 to electrically insulate the conductive gate electrode from the top drain 200. The top spacer 180 can be on a portion of the vertical fin 111. A bottom spacer 141 can physically separate and electrically isolate the gate structure 175 from the substrate 110 including a doped region 119 below a vertical fin that can form a bottom source. A gate dielectric layer 150 can be formed on the bottom spacer and a portion of the vertical fin 111. A work function layer 160 can be formed on the gate dielectric layer 150. The gate structure can be on the tapered end walls and sidewalls of the vertical fin 111, where the thickness of the gate fill layer increases going from the base of the vertical fin to the top.

Figure 14:
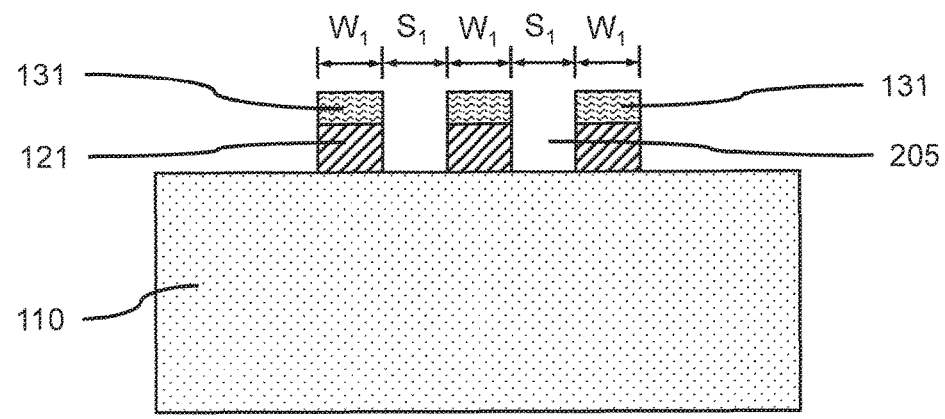
FIG. 14 is a cross-sectional side view showing a plurality of fin mask segments on each of a plurality of fin template segments patterned to form a series of masked regions, in accordance with an embodiment of the present invention.

FIG. 14 is a cross-sectional side view showing a plurality of fin mask segments on each of a plurality of fin template segments patterned to form a series of masked regions, in accordance with an embodiment of the present invention.

In one or more embodiments, the fin mask layer 130 and fin template layer 120 can be patterned on the substrate 110 to form a series of masked regions on a portion of the substrate predetermined to form a single vertical fin 111. The plurality of fin mask segments 131 and fin template segments 121 can be formed instead of one continuous fin mask segment 131 and fin template segment 121 on a surface of the substrate intended to form a vertical fin 111. The fin mask segments 131 and fin template segments 121 can have a predetermined width, Wi, and a predetermined spacing, $S_1$, that define portions of the substrate/vertical fin to be removed to form notches that reduce the area of the top surface, $A_{ts}$, or top cross-sectional area, $A_{tcr}$. In various embodiments, $W_1$ and $S_1$ can be the same distance or different distances. In various embodiments, each fin mask segment 131 and fin template segment 121 can have a different width than other fin mask segments 131 and fin template segments 121 on the same portion of the substrate. The spacing between the fin template segments 121 can also be different.

Figure 15:
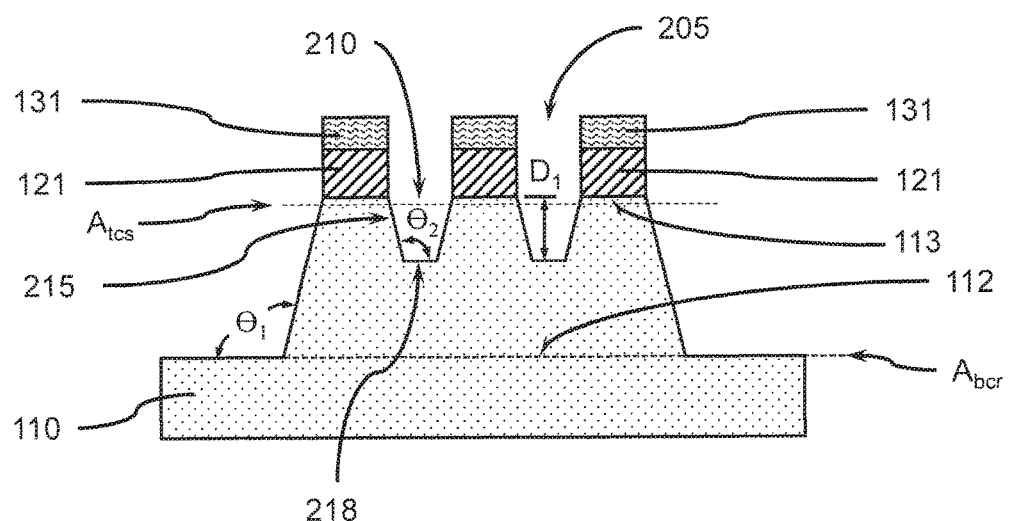
FIG. 15 is a cross-sectional side view showing a vertical fin formed on the substrate with fin template segments and fin mask segments separated by gaps, and notches formed in an upper portion of the vertical fin, in accordance with an embodiment of the present invention.

FIG. 15 is a cross-sectional side view showing a vertical fin formed on the substrate with fin template segments and fin mask segments separated by gaps, and notches formed in an upper portion of the vertical fin, in accordance with an embodiment of the present invention.

In one or more embodiments, a vertical fin 111 can be formed by removing a portion of the substrate 110 between and/or around the plurality of fin mask segments 131 and fin templates 121, where a directional etch, for example, a reactive ion etch (RIE) can remove exposed portions of the substrate 110 or surface active layer not covered by the fin mask segments 131 and fin templates 121. The removal of the substrate material can form vertical fin(s) 111 with a tapered profile having a greater length and width at the base 112 and a shorter length and narrower width at the top surface 113, and notches at the bottom of the gaps between the fin template segments and fin mask segments. The angles, $\theta_1$ and $\theta_2$, can be controlled by the etching process.

The predetermined spacing, $S_1$, can influence the depth, $D_1$, of the notch(es) 210 formed in the vertical fin 111, where the formation of an end wall or a notch 210 can depend on the predetermined spacing, $S_1$, between the fin templates 121. The depth, $D_1$, of the notches can also depend on the spacing, $S_1$, between the fin templates 121, where narrower spacing can reduce the depth of the formed notch 210, and on the parameters of the etching process used to form the notch 210.

In one or more embodiments, notches 210 can be formed in the vertical fin 111 between fin templates 121 to a depth, $D_1$, of less than ½ the height of the vertical fin, or to a depth of less than ⅓ the height of the vertical fin, or to a depth about equal to the thickness of a top spacer 180.

In one or more embodiments, the surface area of the top surface 113, $A_{ts}$, or top cross-sectional area, $A_{tcr}$, of the vertical fin 111 in contact with a bottom surface of a fin template 121 can be less than the cross-sectional area of the base 112, $A_{bcr}$, of the vertical fin at the plane of the substrate surface 99 ($A_{ts}$ or $A_{tcr} < A_{bcr}$) adjacent to the vertical fin. The presence of one or more notch(es) 210 can further reduce the surface area of the top surface 113, $A_{ts}$, or top cross-sectional area, $A_{tcr}$, measured near the top surface 113. The surface area, $A_{ts}$, or cross-sectional area, $A_{tcr}$, at the top of the fin can be in the range of about 10% to about 75% of the cross-sectional area at the base 112 of the fin, $A_{bcr}$, or in the range of about 10% to about 60% of the cross-sectional area at the base 112 of the fin, $A_{bcr}$, or in the range of about 20% to about 45% of the cross-sectional area at the base 112 of the fin, $A_{bcr}$. The configuration and geometry of the vertical fin 111 can determine the reduction in the surface area of the top surface 113, $A_{ts}$, or top cross-sectional area, $A_{tcr}$, in relation to the cross-sectional area at the base 112 of the fin, $A_{bcr}$.

In one or more embodiments, the notches 210 can have an angled wall 215, where the angle, $\theta_2$, of the wall with a bottom surface 218 of the notch can be determined by the parameters of the etching process used to form the notch 210. In various embodiments, the notch 210 can have an essentially flat bottom surface 218 due to the etching process.

Figure 16:
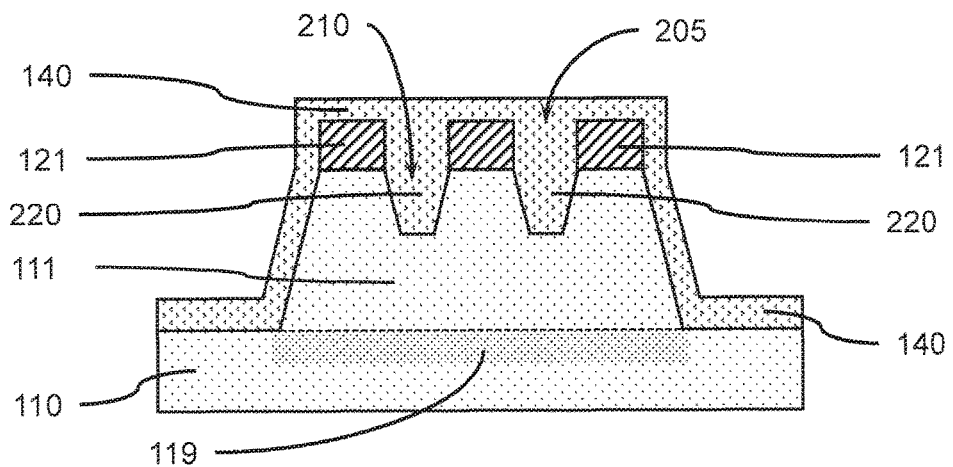
FIG. 16 is a cross-sectional side view showing a spacer layer formed on the vertical fin, fin templates, and in the gaps and notches after removal of the fin mask segments, in accordance with an embodiment of the present invention.

FIG. 16 is a cross-sectional side view showing a spacer layer formed on the vertical fin, fin templates, and in the gaps and notches after removal of the fin mask segments, in accordance with an embodiment of the present invention.

In one or more embodiments, the fin mask segment(s) 131 can be removed using processes known in the art, for example, ashing, stripping, chemical-mechanical polishing, etc. Removal of the fin mask segment(s) 131 can expose the top surface of the fin template(s) 121.

In one or more embodiments, a spacer layer 140 can be formed on the fin template(s) 121, vertical fin(s) 111 and exposed surfaces of the substrate 110, where the spacer layer can also fill in the gap(s) 205 between the fin templates 121 and fin mask segments 131, and the notch(es) 210 in the top portion of the vertical fin(s) 111. The spacer layer 140 can be formed by a directional, blanket deposition, where the thickness of the spacer layer is greater on surfaces parallel with the substrate surface 99, and thinner on surfaces angled or perpendicular to the substrate surface 99. The spacer layer 140 can form dielectric plug(s) 220 in the one or more notch(es) 210 and gap(s) 205.

In various embodiments, a portion of the spacer layer 140 that extends above the top surfaces of the fin templates 121 can be removed, for example, by CMP or etching. The spacer layer 140 can be an insulating dielectric material, where the spacer layer 140 can be silicon oxide (SiO), a high-k dielectric, or a low-k dielectric material.

In various embodiments, the notch(es) 210 can be filled with a dielectric material to form the dielectric plug(s) 220. In various embodiments, the dielectric plug(s) 220 are filled with a low-k material to reduce capacitance between the channel, gate structure, and top drain.

Figure 17:
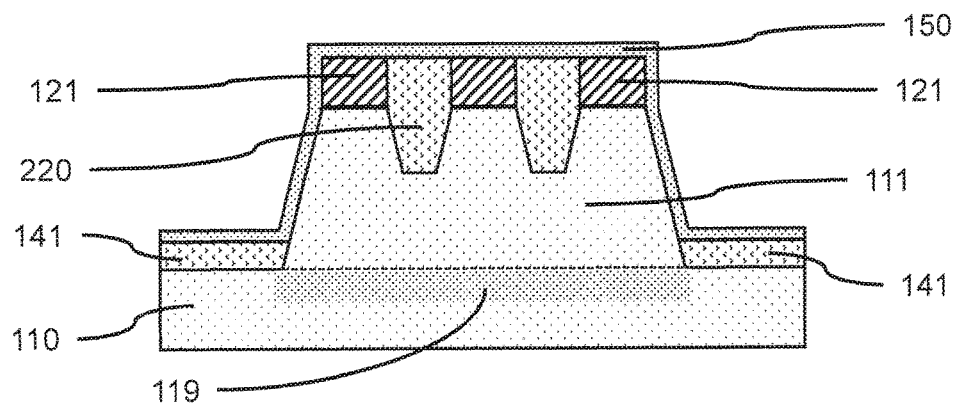
FIG. 17 is a cross-sectional side view showing a gate dielectric layer formed on a bottom spacer, vertical fin, and fin template after removal of the portion of the spacer layer on the vertical fin and fin template, in accordance with an embodiment of the present invention.

FIG. 17 is a cross-sectional side view showing a gate dielectric layer formed on a bottom spacer, vertical fin, and fin template after removal of the portion of the spacer layer on the vertical fin and fin template, in accordance with an embodiment of the present invention.

In one or more embodiments, a portion of the spacer layer 140 can be removed from the vertical fin 111, fin template 121, and an upper portion of gap(s) 205, while a portion of the spacer layer 140 remains on the substrate surface 99 to form one or more bottom spacers 141, and in the notch(es) 210 to form the dielectric plug(s) 220. In various embodiments, the portion of the spacer layer 140 can be removed using an isotropic etch (e.g., wet etch, dry plasma etch, etc.), where thinner portions of the spacer layer 140 can be removed to expose the end walls and sidewalls of the vertical fin(s) 111, while a portion of the spacer layer 140 remains on the substrate surface 99 and in the gap(s) and notch(es) 210. The portion of the spacer layer 140 on the top surface of the fin template 121 can be removed by a chemical-mechanical polishing before performing an isotropic etch.

In one or more embodiments, a gate dielectric layer 150 can be formed on the exposed surfaces of the fin template(s) 121, vertical fin(s) 111, and bottom spacers 141, where the gate dielectric layer 150 can be conformally deposited by ALD, PEALD, CVD, PECVD, or combinations thereof. The gate dielectric layer 150 can be formed on the exposed surfaces of the dielectric plug(s) 220.

In one or more embodiments, the gate dielectric layer 150 can be an insulating dielectric layer, for example, a silicon oxide (SiO), silicon nitride (SiN), silicon oxynitride (SiON), a high-k dielectric, or a suitable combination of these materials.

Figure 18:
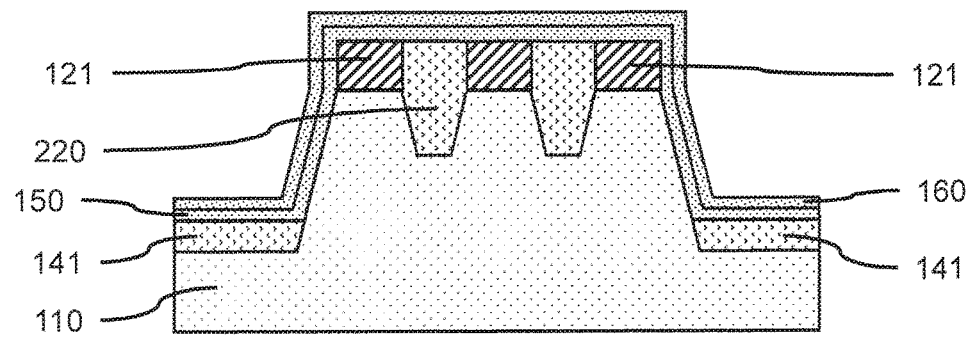
FIG. 18 is a cross-sectional side view showing a work function layer on the gate dielectric layer, in accordance with an embodiment of the present invention.

FIG. 18 is a cross-sectional side view showing a work function layer on the gate dielectric layer, in accordance with an embodiment of the present invention.

In one or more embodiments, a work function layer 160 can be formed on the exposed surfaces of the gate dielectric layer 150, where the work function layer 160 can be conformally deposited by ALD, PEALD, CVD, PECVD, or combinations thereof.

In one or more embodiments, a work function layer 160 can be formed on the gate dielectric layer 150, where the work function layer 160 and gate dielectric layer 150 can surround at least a portion of each of one or more vertical fin(s) 111 as a part of a gate structure. The work function layer 160 and gate dielectric layer 150 also can be on opposite faces of the dielectric plug(s) 220 in the upper portion of the vertical fin(s) 111.

Figure 19:
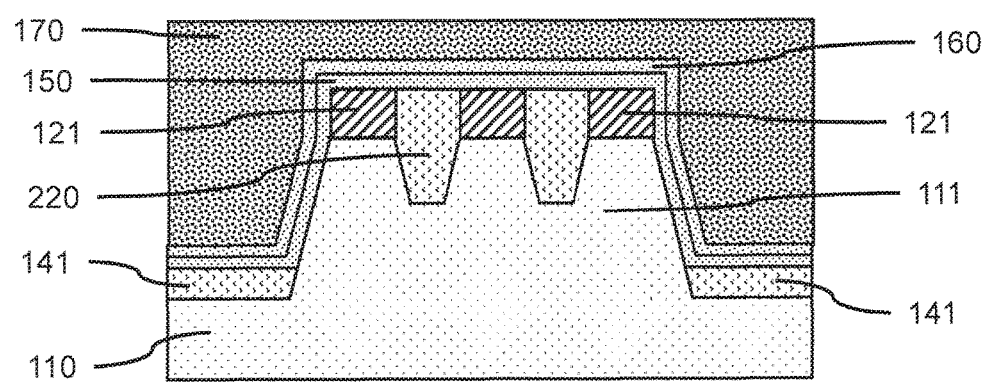
FIG. 19 is a cross-sectional side view showing a gate fill layer on the work function layer, in accordance with an embodiment of the present invention.

FIG. 19 is a cross-sectional side view showing a gate fill layer on the work function layer, in accordance with an embodiment of the present invention.

In one or more embodiments, a gate fill layer 170 can be formed on the gate dielectric layer 150 and/or work function layer 160 if present, where the gate fill layer 170 can fill in the space between vertical fins 111. The gate fill layer 170, gate dielectric layer 150, and optionally the work function layer 160, can form a gate structure on one or more vertical fin(s) 111, where the gate fill layer 170 and work function layer 160 can form a conductive gate electrode. The gate structure formed on the vertical fin 111 can wrap around the two end walls and two sidewalls of each vertical fin 111 to cover at least a portion of the vertical fin forming a channel.

Figure 20:
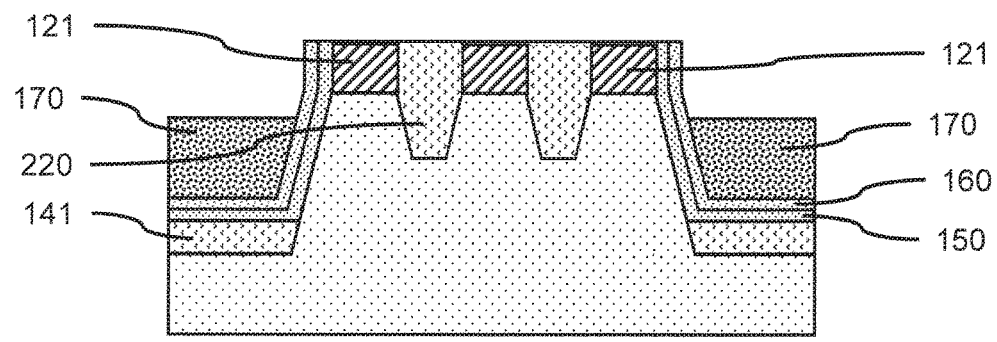
FIG. 20 is a cross-sectional side view showing a gate structure with a reduced height gate fill layer, in accordance with an embodiment of the present invention.

FIG. 20 is a cross-sectional side view showing a gate structure with a reduced height gate fill layer, in accordance with an embodiment of the present invention.

In one or more embodiments, the gate fill layer 170 and work function layer 160 if present, can be recessed to provide space for formation of a subsequent top spacer layer. In various embodiments, each of the gate fill layer 170, gate dielectric layer 150 and/or work function layer 160 can be partially removed using a selective etch (e.g., RIE). The gate fill layer 170, gate dielectric layer 150 and/or work function layer 160 can be reduced to a depth equal to or below the fin template(s) 121 to provide space for formation of a top spacer, and top source/drains on the top surfaces of the vertical fin(s) 111. The height of the gate electrode can determine the length of a channel in a vertical transport field effect transistor (VTFET). In various embodiments, the gate structure can wrap around a middle portion of the vertical fin 111. The gate structure can cover at least a portion of the dielectric plug(s) 220, where the notch(es) 210 have been formed to a depth, $D_1$, below the top surface of the gate fill layer 170 and gate structure. The presence of the dielectric plug(s) 220 within the VTFET channel surrounded by the gate structure can alter the electrical properties of the channel.

Figure 21:
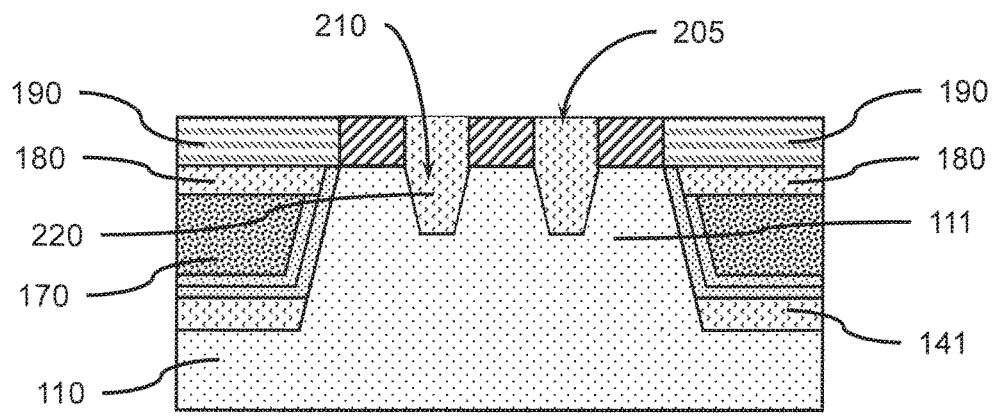
FIG. 21 is a cross-sectional side view showing a gate structure formed on the vertical fin, and a top spacer formed on the exposed portions of the gate structure, in accordance with an embodiment of the present invention.

FIG. 21 is a cross-sectional side view showing a gate structure formed on the vertical fin, and a top spacer formed on the exposed portions of the gate structure, in accordance with an embodiment of the present invention.

In one or more embodiments, a top spacer layer 180 can be formed on the gate fill layer 170, gate dielectric layer 150 and/or work function layer 160 of the gate structure, where the top spacer layer 180 can be blanket deposited, for example, by CVD, PECVD, PVD, etc. In various embodiments, the height of the top spacer layer 180 can be reduced, for example, by CMP and/or an RIE, to equal to or below the bottom surface of the fin template 121. The top surface of the top spacer layer 180 can be level with the top surface of the vertical fin 111.

In one or more embodiments, the top spacer layer 180 can be a silicon nitride (SiN), a carbon-doped silicon nitride (SiCN), a silicon oxynitride (SiON), silicon boro crbonitride (SiBCN), silicon oxycarbonitride (SiOCN), or combinations thereof. The silicon nitride can include stoichiometric silicon nitride ($Si_3N_4$) and other stoichiometric ratios of silicon and nitrogen.

In one or more embodiments, a top spacer layer 180 can be the same material or used for the bottom spacer layer 140, a different material, or multiple layers thereof.

In one or more embodiments, an interlayer dielectric (ILD) layer 190 can be formed on the top spacer layer 180, fin template 121, and gate dielectric layer 150. The ILD layer 190 can be silicon oxide (SiO), a flowable oxide, a polymeric material, a low-k dielectric, or combinations thereof. A low-k dielelctric material can include, but not be limited to, a fluoride-doped silicon oxide (e.g., fluoride doped glass), a carbon doped silicon oxide, a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof.

Figure 22:
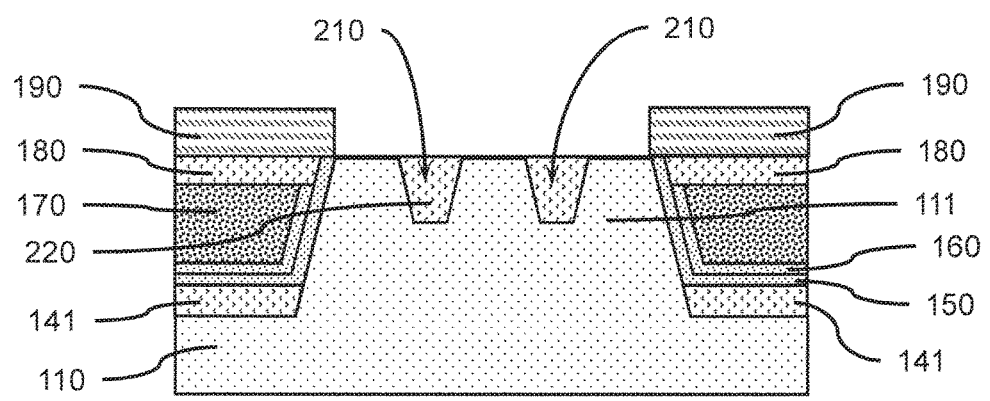
FIG. 22 is a cross-sectional side view showing a vertical fin with an exposed top surface and dielectric plugs after removal of the fin templates, in accordance with an embodiment of the present invention.

FIG. 22 is a cross-sectional side view showing a vertical fin with an exposed top surface and dielectric plugs after removal of the fin templates, in accordance with an embodiment of the present invention.

In one or more embodiments, a portion of the interlayer dielectric (ILD) layer 190 can be removed to expose the fin template 121, where the ILD layer extending above the fin template 121 may be removed using CMP.

In one or more embodiments, the exposed fin templates 121 can be removed, for example, by using a selective etch (e.g., RIE, wet etch, etc.) to expose the top surface of the vertical fin 111 on opposite sides of a dielectric plug 220. The vertical fin 111 can be a single crystal material with a predetermined crystal orientation at the top surface.

In one or more embodiments, the upper portion of the dielectric plug 220 previously in the gap(s) 205 can be removed by a selective, directional etch (e.g., RIE) to reduce the height of the dielectric plug 220 to the level of the top surface of the vertical fin 111.

Figure 23:
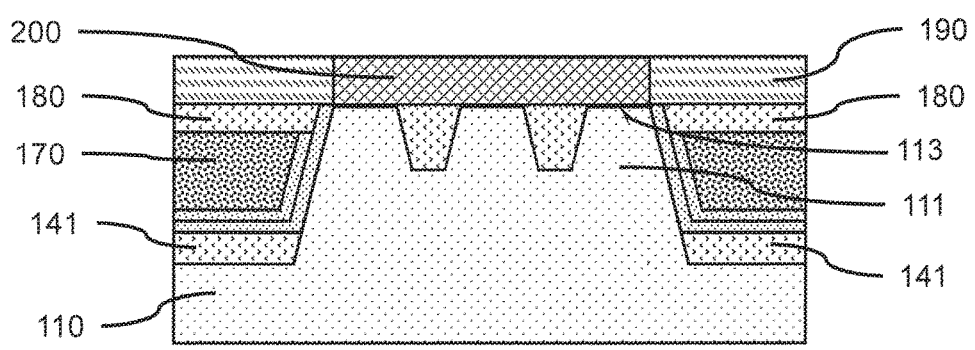
FIG. 23 is a cross-sectional side view showing a top source/drain formed on the vertical fin, in accordance with an embodiment of the present invention.

FIG. 23 is a cross-sectional side view showing a top source/drain formed on the vertical fin, in accordance with an embodiment of the present invention.

In one or more embodiments, a top source/drain 200 can be formed on the exposed portions of the top surface 113 of the vertical fin 111, where the top source/drain 200 can be formed by an epitaxial growth process on a single crystal surface of the vertical fin. The top source/drain 200 may be suitably doped to form an n-type or a p-type FinFET device.

In various embodiments, the top source/drain 200 can be formed on the dielectric plug(s) 220, where the top source/drain 200 spans the distance between exposed surface portions of the vertical fin 111.

Figure 24:
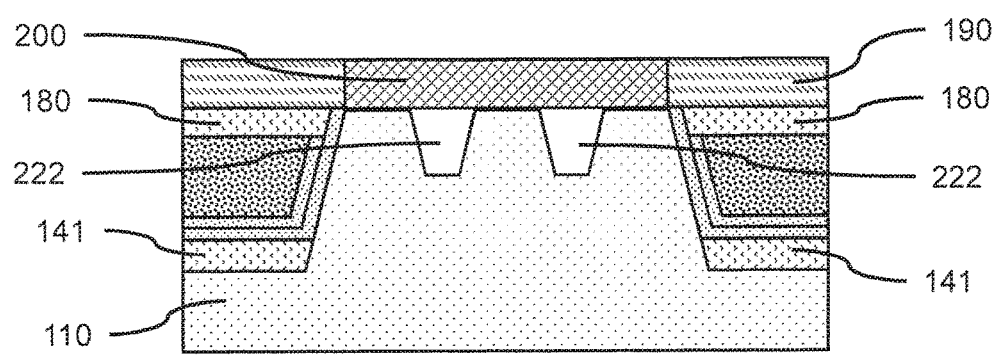
FIG. 24 s a cross-sectional side view showing void spaces formed by removal of the dielectric plugs, and a top source/drain formed on the vertical fin across the void spaces, in accordance with an embodiment of the present invention.

FIG. 24 s a cross-sectional side view showing void spaces formed by removal of the dielectric plugs, and a top source/drain formed on the vertical fin across the void spaces, in accordance with an embodiment of the present invention.

In one or more embodiments, the dielectric plug 220 may be selectively removed using an isotropic etch (e.g., a wet etch) to form void spaces 222 within the vertical fin 111 between a channel and the top drain 200, where the void spaces 222 reduce the channel-drain capacitance, since air has a lower dielectric constant (i.e., k=1) compared to the dielectric constant of the material forming the dielectric plug(s) 220.

Figure 25:
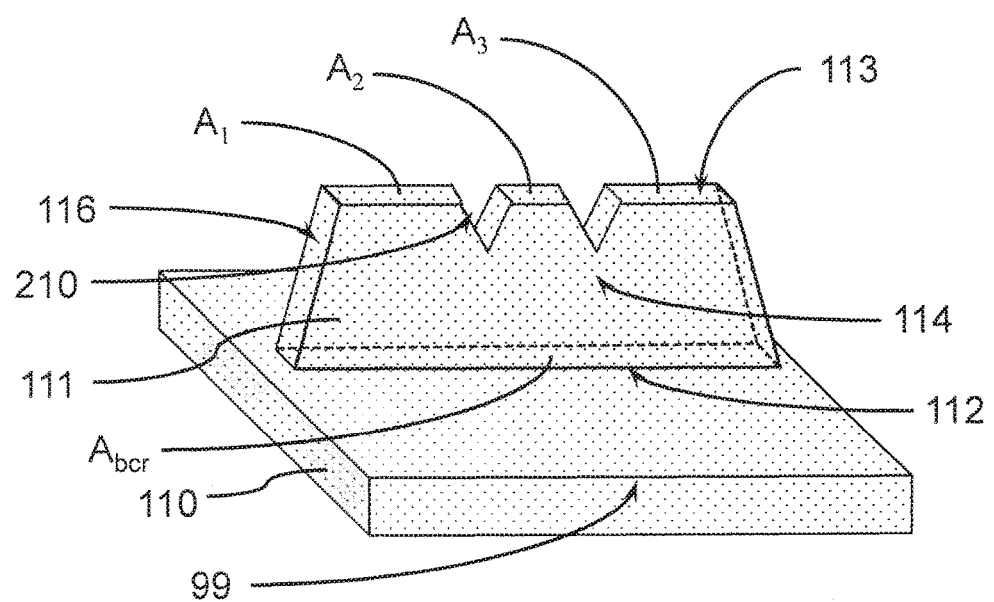
FIG. 25 is an orthographic cut-away view of an exemplary vertical fin having inclined end walls and sidewalls, and notches formed in the upper portion and top surface of the vertical fin, in accordance with an embodiment of the present invention.

FIG. 25 is an orthographic cut-away view of an exemplary vertical fin having inclined end walls and sidewalls, and notches formed in the upper portion and top surface of the vertical fin, in accordance with an embodiment of the present invention.

In one or more embodiments, a vertical fin 111 on a substrate 110, may have a base 112 with a length, $L_1$ (forming a long axis), and a top surface 124 with a length, $L_2$, where $L_2<L_1$, a width (forming a short axis), and a height from the top surface 113 of the vertical fin 111 to the base 112 of the fin at the surface 99 of the substrate 110. An edge of a sidewall may taper inwards from the base 112 of the vertical fin 111 to the top surface 113, forming a trapezoidal sidewall joining with inclined end walls. The end wall(s) can form the channel angle, $\theta_1$, to the substrate surface 99, where $\theta_1$ may be an angle describing the degree of inclination from a source to a drain. The channel angle, $\theta_1$, may be an obtuse angle (i.e., >90°). The angle of inclination, $\theta_1$, may be the same or different for each of the end walls. The notches 210 can have flat or pointed bottoms.

In various embodiments, a vertical fin 111 may have two sidewalls 114 separated by a width (i.e., thickness) and two end walls 116 separated by a length, where an edge of the end wall(s) may taper inwards from the base 112 of the vertical fin 111 to the top surface 113, forming a trapezoidal end wall joining with inclined sidewalls 114.

In various embodiments, the end walls 116 and sidewalls 114 may both taper inwards to form a pyramidal vertical fin 111, where the cross-sectional area at the interface of the base 112 of the vertical fin 111 with the substrate 110 is greater than the cross-sectional area at the interface of the top of the vertical fin and a top drain. The end walls 116 and/or sidewalls 114 may not be perpendicular to the substrate surface 99.

In one or more embodiments, a portion of the vertical fin 111 can be removed from a section along the top surface 113 to form a notch 210. The notch 210 may extend from the top surface 113 downward towards the base 112 of the vertical fin 111, where the notch 210 may have a width and a depth from the top surface 113. In various embodiments, the notch 210 spans the width of the vertical fin 111, but does not extend to the surface 99 of the substrate 110, instead the notch 210 ends above the base 112 of the vertical fin 111. The lowest point of the notch 210 may be above the midpoint of the height of the vertical fin 111. In various embodiments, the notch 210 may have a V-shape or truncated V-shape etched into the top surface 113 of the vertical fin 111.

The notch 210 may be rectangular, wedge-shaped, truncated wedge-shaped, semi-cylindrical, D-shaped, or any other shape suitable for reducing the contact area between a top drain and the top surface of the VTFET channel without penetrating to the level of the substrate. If the notch 210 has planar sidewalls, the sidewalls may form an angle of $\theta_2$ with each other or with a flat bottom surface 218 of the notch 210.

In one or more embodiments, a plurality of notches 210 may be formed in the vertical fin(s) 111, where the notches 210 may be placed symmetrically along the top surface 113, such that the distance between neighboring notches 210 are equidistant from each other and the edge of the top surface 113 that meets with an end wall 116, or asymmetrically along the top surface 113, such that the distances between neighboring notches 210 are not equidistant from each other and/or the edge of the top surface 113 that meets with an end wall 116. The notches 210 may be aligned approximately parallel (e.g., ±2°, ±1°, or ±0.5° with the short axis (i.e., width) of the vertical fin 111.

In various embodiments, the cross-sectional area at the top of the fin is in the range of about 10% to about 75% of the cross-sectional area, or about 10% to about 60% of the cross-sectional area at the base of the fin, or about 15% to about 50% of the cross-sectional area at the base of the fin, or about 20% to about 45% of the cross-sectional area at the base of the fin, where the total cross-sectional or surface area can be the sum of two or more areas (e.g., $A_1$, $A_2$, $A_3$, etc.) separated by notches 210.

In one or more embodiments, a vertical fin 111 can have a cross-sectional area, $A_{bcr}$, at the base of the vertical fin, and a cross-sectional area, $A_{ts}$, at the top surface 113 of the vertical fin, where the cross-sectional area, $A_{ts}$, may be the sum of cross-sectional areas, $A_1+A_2+A_3+A_n$, etc., for each individual area at the top of the vertical fin separated by an intervening notch 210. The cross-sectional area, $A_{bcr}$, at the base 112 of the vertical fin that may be larger than a cross-sectional area, $A_{ts}$, at the top surface of the fin ($A_{bcr} > A_{ts}$). The sum of $A_1$, $A_2$, $A_3$, etc. can, therefore, be about 10% to about 75% or about 10% to about 60% of the cross-sectional area at the base, $A_{bcr}$, of the vertical fin 111. One or more notches in the vertical fin can reduce the surface area at the top of the vertical fin by about 40% to about 70% compared to the cross-sectional area at the top of the vertical fin without one or more notches.

In a non-limiting example of a vertical transport finFET structure, a vertical fin can form a channel with inclined endwalls and a plurality of wedge-shaped portions removed from an upper section of the vertical fin to form notches.

Figure 26:
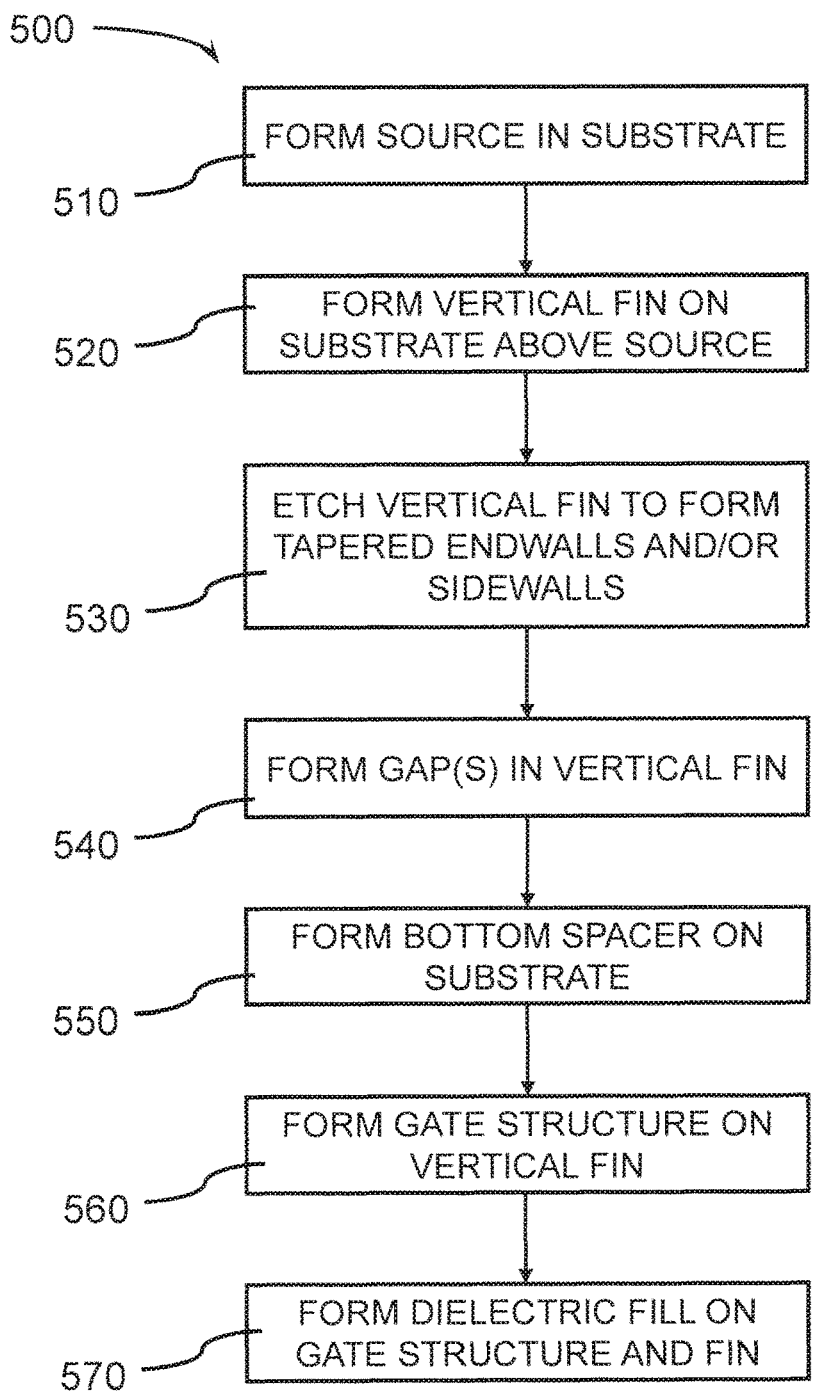
FIG. 26 is a block/flow diagram illustrating a method of forming a VTFET with reduced drain capacitance and reduced source resistance, in accordance with an embodiment of the present principles.

FIG. 26 is a block/flow diagram illustrating a method of forming a VTFET with reduced drain capacitance and reduced source resistance, in accordance with an embodiment of the present principles.

A VTFET may be fabricated by a method 500 that provides a smaller cross-sectional area at the top of the vertical fin than at the base of the vertical fin.

In block 510, a dopant may be introduced into at least a region of a substrate on which a VTFET device may be fabricated. The dopant may be introduced into the substrate to form a bottom source for a vertical fin device, where a doped region may be formed and annealed to activate the dopants to form the bottom source. In various embodiments, a drain is not formed in the substrate for the VTFET device.

In various embodiments, the bottom source may be doped in-situ or ex-situ, for example, through ion implantation or thermal diffusion of dopants into the substrate. The dopant of the source may be activated by annealing. Other suitable doping techniques may also be used, including but not limited to, gas phase doping, plasma doping, plasma immersion ion implantation, cluster doping, infusion doping, liquid phase doping, solid phase doping, or combinations thereof.

In block 520, one or more vertical fins may be formed on the substrate, where the vertical fins may be formed by a sidewall image transfer (SIT) process, for example, self-aligned double patterning (SADP), or self-aligned quadruple patterning (SAQP). An active semiconductor layer may be epitaxially grown on the substrate to a predetermined thickness, where the source may be buried beneath the active layer. A fin template layer, which may be a hardmask layer, may be formed on the active layer. A mandrel layer may be formed on the fin template layer, where the mandrel layer can be, for example, amorphous silicon or silicon-germanium, for forming dummy mandrels. A mandrel template layer can be formed on the mandrel layer, where the mandrel template layer can be a hardmask layer. A softmask layer can be formed on the mandrel template layer, where the softmask layer can be patterned and developed to form a mandrel pattern exposing portions of the mandrel template layer. The mandrel pattern can be transferred from the softmask layer to the mandrel template layer and mandrel layer by anisotropic directional etching, for example, a dry plasma etch or reactive ion etch (RIE), to form one or more dummy mandrels. Spacers can be formed on the sidewalls of the mandrels, for example, by a blanket or conformal deposition and etch back. The spacers can form a fin pattern that may be transferred to the fin template layer to form fin templates and the active layer to form a plurality of vertical fins by RIE.

In one or more embodiments, formation of the vertical fins by RIE using the spacers and/or fin templates can provide a tapered profile or a vertical profile by adjusting and/or controlling the etching process as would be known in the art.

In block 530, vertical fins provided with a vertical profile in block 520 may be further etched to provide a tapered profile, where the etching process may be selected or adjusted to achieve a predetermined taper angle, as would be known in the art.

In block 540, the vertical fins may be suitably masked and notches formed in the top portion of the vertical fins. The notch(es) may be formed by etching away an exposed portion of the vertical fin to a predetermined depth, dimension, and profile.

In block 550, a dielectric material may be formed on the substrate and the vertical fin to form a bottom spacer for the VTFET device. The dielectric material may be blanket deposited over the substrate and may fill in at least a portion of the notches to form a dielectric plug.

In block 560, a gate structure can be formed on the vertical fin by depositing a gate dielectric layer on the bottom spacer and the sidewalls and end walls of the vertical fin. A conductive gate electrode may be formed on the gate dielectric, where the gate electrode may include a work function layer and/or a gate fill. The gate fill layer can be a metal, and the work function layer can be a conductive metal nitride, metal carbide, or combination thereof.

The gate dielectric layer and gate electrode may fill in at least a portion of one or more notches in the vertical fin.

In block 570, a dielectric fill may be formed on the gate structure and the vertical fin to form a top spacer.

In one or more embodiments, a vertical transport FET may be fabricated having a bottom source formed in the substrate 110, a vertical fin 111 formed on the substrate above the bottom source, a gate contact can be electrically coupled to a gate structure 175 on the vertical fin 111, and a top drain 200 can be on at least a portion of the top surface 113 of the vertical fin 111.

In one or more embodiments, a vertical fin 111 may form a channel for a vertical transport fin field effect transistor (VTFET), where current flows vertically from a doped region forming a bottom source 119 in the substrate 110 through the vertical fin 111 forming the channel to a top drain 200. A gate structure 175 can be formed on one or more of the sidewalls 114 and/or end walls 116 of the vertical fin, where the gate structure 175 can form a central gated region between the base of the vertical fin and the top of the vertical fin configured to control current flow through the channel of the VTFET.

In one or more embodiments, the gate structure 175 can include a gate dielectric layer 150 on at least a portion of the vertical fin 111, and a conductive gate electrode on at least a portion of the gate dielectric layer, where the gate dielectric layer electrically insulates the gate electrode from the VTFET channel. The conductive gate electrode may include a work function layer 160 and a gate fill layer 170, where the work function layer can be on at least a portion of the gate dielectric layer, and the gate fill layer can be on at least a portion of the work function layer, such that the work function layer 160 may be between the gate dielectric layer and the gate fill layer.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or including, when used herein, specify the presence of stated features, integers, steps, operations, elements and/or components, but do not preclude the presence or addition of one or ore other features, integers, steps, operations, elements, components and/or groups thereof.

Spatially relative terms, such as "beneath," "below," "lower," "above " "upper," and the like, can be used herein for ease of description to describe one element's or feature's relationship to another element(s) or feature(s) as illustrated in he FIGS. It will be understood that the spatially relative terms are intended to encompass different orientations of the device in use or operation in addition to the orientation depicted in the FIGS. For example, if the device in the FIGS. is turned over, elements described as "below" "beneath" other elements or features would then be oriented "above" the other elements or features. Thus, the term "below" can encompass both an orientation of above and below. The device can be otherwise oriented (rotated 90 degrees or at other orientations),and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertical transport fin field effect transistor (VTFET) with a smaller cross-sectional area at the top of the fin than at the base of the fin, comprising:
    forming a vertical fin on a substrate, wherein the vertical fin has two sidewalls separated by a thickness, and two end walls separated by a length; and
    etching the fin to taper at least the end walls, such that the cross-sectional area at the top of the fin is in the range of about 10% to about 75% of the cross-sectional area at the base of the vertical fin.

2. The method of claim 1, further comprising forming one or more notches in the top portion of the vertical fin to further reduce the cross-sectional area at the top surface of the vertical fin.

3. The method of claim 2, wherein the one or more notches have a flat bottom.

4. The method of claim 2, further comprising forming a gate structure on at least a portion of the fin that wraps around the two sidewalls and the two end walls, and defines a channel length.

5. The method of claim 2, further comprising forming a dielectric material in the one or more notches.

6. The method of claim 5, wherein the dielectric material is a low-k dielectric material.

7. The method of claim 5, further comprising forming a gate dielectric layer on the vertical fin and the dielectric material in the one or more notches.

8. The method of claim 7, further comprising forming a doped region in the substrate below the vertical fin.

9. The method of claim 8, further comprising forming a bottom spacer on the substrate adjoining the two sidewalls and two end walls of the vertical fin.

10. A method of forming a vertical transport fin field effect transistor (VTFET) with a smaller cross-sectional area at the top of the fin than at the base of the fin, comprising:
forming a doped region in a substrate; and
forming a vertical fin on the substrate, wherein the vertical fin has two sidewalls separated by a thickness and two end walls separated by a length, wherein the doped region is below the vertical fin, and wherein each of the end walls forms an obtuse angle with the substrate surface, such that the cross-sectional area at the top of the fin is in the range of about 10% to about 75% of the cross-sectional area at the base of the vertical fin.

11. The method of claim 10, further comprising forming a bottom spacer on the substrate adjoining the two sidewalls and two end walls of the vertical fin.

12. The method of claim 10, further comprising forming one or more notch(es) in the upper portion of the vertical fin.

13. The method of claim 12, further comprising forming a dielectric plug in each of the one or more notch(es).

14. The method of claim 13, further comprising forming a gate dielectric layer on the vertical fin and the dielectric plug in each of the one or more notches.

15. The method of claim 13, further comprising forming a top source/drain on the exposed, top surface of the vertical fin.

16. A method of forming a vertical transport fin field effect transistor (VTFET) with a smaller cross-sectional area at the top of the fin than at the base of the fin, comprising:
forming a doped region in a substrate;
forming a vertical fin on the doped region, wherein the vertical fin has two sidewalls separated by a thickness and two end walls separated by a length, and wherein each of the end walls forms an obtuse angle with the substrate surface; and
forming one or more notch(es) in the upper portion of the vertical fin.

17. The method of claim 16, further comprising forming a dielectric plug in each of the one or more notch(es).

18. The method of claim 17, further comprising forming a bottom spacer on the substrate adjoining the two sidewalls and two end walls of the vertical fin.

19. The method of claim 18, further comprising forming a gate dielectric layer on the bottom spacer, the vertical fin, and the dielectric plug in each of the one or more notches; and
forming a conductive gate electrode on the gate dielectric layer.

20. The method of claim 19, further comprising forming a top spacer layer on the conductive gate electrode, and forming a top source/drain on the top surface of the vertical fin, wherein the top surface of the vertical fin has a cross-sectional area in a range of about 20% to about 45% of the cross-sectional area at the base of the vertical fin.

* * * * *